United States Patent
Jang et al.

(10) Patent No.: US 10,103,260 B1
(45) Date of Patent: Oct. 16, 2018

(54) SEMICONDUCTOR DEVICE STRUCTURE HAVING LOW RDSON AND MANUFACTURING METHOD THEREOF

(71) Applicant: MagnaChip Semiconductor, Ltd., Cheongju-si (KR)

(72) Inventors: Jae Hyung Jang, Daejeon (KR); Hee Hwan Ji, Daejeon (KR); Jin Yeong Son, Daejeon (KR)

(73) Assignee: Magnachip Semiconductor, Ltd., Cheongju-si (KR)

( * ) Notice: Subject to any disclaimer, the term of this patent is extended or adjusted under 35 U.S.C. 154(b) by 0 days.

(21) Appl. No.: 15/826,921

(22) Filed: Nov. 30, 2017

(30) Foreign Application Priority Data

Mar. 29, 2017 (KR) ........................ 10-2017-0039978

(51) Int. Cl.
*H01L 29/78* (2006.01)
*H01L 29/66* (2006.01)
*H01L 21/265* (2006.01)
*H01L 21/266* (2006.01)

(52) U.S. Cl.
CPC ........ *H01L 29/7835* (2013.01); *H01L 21/266* (2013.01); *H01L 21/26586* (2013.01); *H01L 29/66492* (2013.01); *H01L 29/66681* (2013.01); *H01L 29/7816* (2013.01)

(58) Field of Classification Search
CPC ........... H01L 29/66659; H01L 29/7835; H01L 29/78624
See application file for complete search history.

(56) References Cited

U.S. PATENT DOCUMENTS

| | | | |
|---|---|---|---|
| 5,811,338 A | 9/1998 | Kao et al. | |
| 6,482,724 B1 | 11/2002 | Chatterjee | |
| 6,916,716 B1 | 7/2005 | Goad et al. | |
| 7,821,082 B1 * | 10/2010 | Lin | H01L 29/7835 257/409 |
| 8,236,657 B2 | 8/2012 | Fung | |
| 8,426,279 B2 | 4/2013 | Chen | |
| 8,735,238 B2 | 5/2014 | Chang et al. | |
| 9,099,556 B2 * | 8/2015 | Chu | H01L 29/7835 |
| 2010/0244128 A1 * | 9/2010 | Bulucea | H01L 21/26513 257/335 |
| 2015/0349065 A1 | 12/2015 | Li et al. | |

* cited by examiner

*Primary Examiner* — David Vu
*Assistant Examiner* — Brandon Fox
(74) *Attorney, Agent, or Firm* — NSIP Law

(57) ABSTRACT

A semiconductor device including a first P-type well region and an asymmetric second P-type well region each formed in a semiconductor substrate; a gate insulating layer and a gate electrode formed on the substrate; a first N-type source/drain region and a second N-type source/drain region that are formed on respective sides of the gate electrode; and an asymmetric LDD region of N-type formed to extend from the second source/drain region, wherein the asymmetric second P-type well region encompasses the second N-type source/drain region and the asymmetric LDD region, and the first N-type source/drain region both the asymmetric second P-type well region and the substrate, and the asymmetric second P-type well region is formed encompassing the second N-type source/drain region and in contact with the first N-type source/drain region.

20 Claims, 12 Drawing Sheets

SEMICONDUCTOR DEVICE STRUCTURE HAVING LOW RDSON AND MANUFACTURING METHOD THEREOF

CROSS-REFERENCE TO RELATED APPLICATIONS

This application claims the benefit under 35 USC 119(a) of Korean Patent Application No. 10-2017-0039978 filed on Mar. 29, 2017, in the Korean Intellectual Property Office, the entire disclosure of which is incorporated herein by reference for all purposes.

BACKGROUND

1. Field

The following description relates to a semiconductor device structure having low on-state resistance (Rdson) and a manufacturing method thereof. The following description more particularly relates to a semiconductor device having an asymmetric lightly doped drain (LDD) region and an asymmetric well region and a manufacturing method thereof.

2. Description of Related Art

Due to trends in electronics, semiconductor chips require a reduced chip size and a smaller transistor size. Semiconductor devices are more competitive when they are smaller in size but still retain or improve performance.

Accordingly, asymmetric or hybrid devices are under development. The LDD depths of a first source/drain and a second source/drain are different from each other in a conventional hybrid semiconductor device. For instance, an LDD process having a shallow depth is applied to the first source/drain and an LDD process having a deep depth is applied to the second source/drain.

However, many masks are needed to manufacture a hybrid device with such various depths. The cost for manufacturing masks increases correspondingly, and the manufacturing time of a semiconductor device (i.e., turn-around time, 'TAT') is lengthened. Also, it is not possible to acquire a desired on-state resistance between source and drain (Rdson) using conventional processes.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a semiconductor device structure can improve Rdson performance between source and drain by using an asymmetric LDD structure and an asymmetric well structure.

Also, the examples are directed to providing a manufacturing method of semiconductor devices at low cost by reducing the number of masks used for a semiconductor device by forming a well region and LDD regions, after a gate formation process, using asymmetric mask patterns.

In one general aspect, a semiconductor device includes a first P-type well region and an asymmetric second P-type well region formed in the semiconductor substrate; a gate insulating layer and a gate electrode formed in the substrate; a first N-type source/drain region and a second N-type source/drain region that are respectively formed besides the gate electrode; and an asymmetric LDD region of N-type that is formed extended from the second source/drain region, wherein the asymmetric P-type second well region encompasses the second N-type source/drain region and the asymmetric LDD region, and the first source/drain region is in contact with both the asymmetric P-type second well region and the substrate, and the asymmetric P-type second well region is formed shifted towards the second source/drain region rather than towards the first source/drain region.

The semiconductor device may further include a first bulk region of P-type that is formed apart from the first N-type source/drain region and is formed inside the first well region of P-type; a second bulk region of P-type that is formed apart from the second N-type source/drain region and is formed inside the asymmetric second well region of P-type; a first trench formed between the first N-type source/drain region and the first P-type bulk region; and a second trench formed between the second N-type source/drain region and the second P-type bulk region.

The semiconductor device may further include a first spacer that is formed overlapped with the first N-type source/drain region and a second spacer that is formed overlapped with the second N-type source/drain region.

The second P-type well region may be formed spaced apart from the first trench.

The edge of the second P-type well region may not extend beyond the outer edge of the first spacer.

The asymmetric N-type LDD region may not be formed with the first N-type source/drain region.

The asymmetric second P-type well region may partly encompass the first N-type source/drain region.

The cross-sectional area of the asymmetric second well region of P-type and the cross-sectional area of the well region of P-type may be different from each other.

In another general aspect, the manufacturing method of the semiconductor device includes, forming a gate insulating layer and a gate electrode in the substrate; forming a photoresist in the substrate and the gate electrode; forming an asymmetric mask pattern that exposes a part of the gate electrode by patterning the photoresist; forming an asymmetric second P-type well region in the substrate by performing first implantation to pass through a part of the exposed gate electrode; forming an asymmetric LDD region of N-type that is overlapped on one side of the gate electrode on the second well region by performing second implantation using the asymmetric mask pattern as a mask; and forming a first N-type source/drain region and a second N-type source/drain region beside the gate electrode in the substrate; wherein the second N-type source/drain region is formed in contact with the asymmetric LDD region of N-type, and the asymmetric second well region of P-type is formed shifted more towards the second N-type source/drain region than the first N-type source/drain region.

The second implantation is an angled implantation in which an implantation angle is inclined.

The manufacturing method of the semiconductor device further comprises forming the first spacer overlapping with the first N-type source/drain region on the side of the gate electrode; and forming the second spacer overlapping with the second N-type source/drain region; and the edge of the asymmetric second P-type well region may not exceed the outer edge of the first spacer.

The manufacturing method of the semiconductor device may further include forming first and second trenches apart from each other in the substrate; forming a first P-type bulk region apart from the first N-type source/drain region, having the first trench in between the regions, by performing implantation by using the mask pattern covering the entire area of the gate electrode; and forming a second P-type bulk region apart from the second N-type source/drain region, having the second trench in between the regions.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1A:
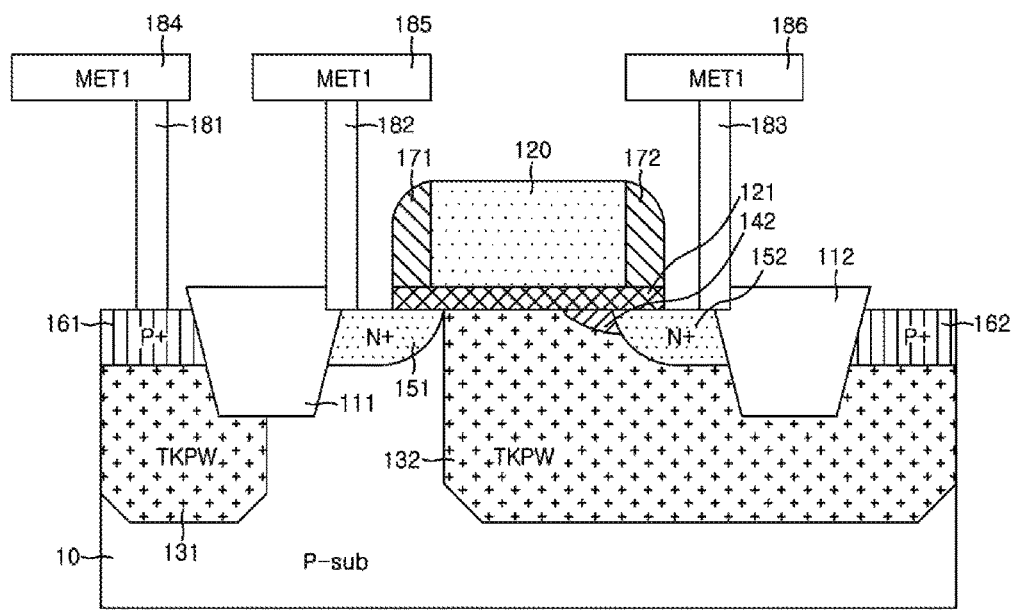
FIG. 1A is a drawing illustrating a structure of an NMOS semiconductor device according to an example.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a", "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Expressions such as "first conductivity type" and "second conductivity type" as used herein may refer to opposite conductivity types such as N-type and P-type conductivity types, and examples described herein using such expressions encompass complementary examples as well. For example, an example in which a first conductivity type is N and a second conductivity type is P encompasses an example in which the first conductivity type is P and the second conductivity type is N.

FIG. 1A is a drawing illustrating the structure of an N-type Metal Oxide Semiconductor (NMOS) device according to an example.

As illustrated in FIG. 1A, the NMOS device according to an example includes an N-type first source/drain region 151 and a second N-type source/drain region 152 in the semiconductor substrate 10. Herein the first source/drain region 151 serves as a source, and the second source/drain region 152 can serve as a drain. The opposite is also possible. Namely, in another example, the first source/drain region 151 can serve as a drain, and the second source/drain region 152 can serve as a source. However, in an example of an asymmetric semiconductor device, an explanation will be given with the assumption that the first source/drain region 151 serves as a source, and the second source/drain region 152 serves as a drain. The NMOS device includes an N-type asymmetric LDD (lightly doped drain) region 142 formed to extend from the second source/drain region 152. An N-type asymmetric LDD region, such as N-type asymmetric LDD region 142, is not formed to extend from the first N-type source/drain region 151. A depth of the asymmetric LDD region 142 is shallower than a depth of the second source/drain region 152 with respect to an upper surface of the substrate. The asymmetric LDD region 142 is formed to extend from the second source/drain region 152 and has an effect of reducing the electric field. Due to this effect, the asymmetric LDD region 142 restrains the generation of hot carriers and it is beneficial in terms of reliability. Herein, the reason for the term "asymmetric LDD region" is because a LDD region is not formed to extend from the first source/drain region 151. The first source/drain region 151 is in contact with both a second well region of P-type 132 and a semiconductor substrate 10.

When a symmetric LDD region is not formed extending from the first source/drain region 151, a punch-through between the first source/drain region 151 and the second source/drain region 152 in the short channel can be restrained. This is because, since there is no symmetric LDD region, the channel length becomes longer as compared with the case where a symmetric LDD region exists. Also, since there is no symmetric LDD region, there is a margin to further reduce the channel length. By removing the symmetric LDD region, a spatial margin to adjust the channel length to be shorter is generated. The channel length of the asymmetric device can be formed shorter compared to the symmetric device. The threshold voltage decreases as the channel length is shortened. Accordingly, the value of Rdson (on-state resistance between source and drain) decreases and the value of the threshold voltage (hereinafter, Vt) decreases and thus, the current between the first source/drain region 151 and the second source/drain region 152 (Idsat) is increased in the asymmetrical device as compared with the symmetrical device. Further, the NMOS device includes a P-type first well region 131 and a P-type second well region 132. The P-type first well region 131 encompasses a P-type first bulk region 161. The second P-type well region 132 is formed apart from the P-type first well region 131. The second P-type well region 132 encompasses the N-type second source/drain region 152 and the asymmetric LDD region 142. Also, the second P-type well region 132 encompasses a P-type second bulk region 162.

The second P-type well region 132 serves as a channel between the first source/drain region 151 and the second source/drain region 152. The second P-type well region 132 has an asymmetric structure. In contrast, a P-type well region 132 of a conventional medium voltage device in FIG. 13(b) has a left and right symmetrical structure. Meanwhile, P-type well regions 132 and N-type well region 137 each have an asymmetric structure, as shown in figures herein.

Therefore, the semiconductor device according to an example has a structure of an asymmetric P-type well region as well as an asymmetric LDD region 142. The asymmetric LDD region 142 and asymmetric P-type well region 132, according to an example herein, may be formed adjacent to the second source/drain region 152 without a corresponding LDD region and P-type well region formed adjacent to the first source/drain region 151. By using the asymmetric LDD region 142 and the second P-type well region 132, the effects of Vt reduction, Rdson reduction, and Idsat increase are generated. Further, the cross-sectional area of the second P-type well region 132 is larger than the cross-sectional area of the first P-type well region 131.

A portion of semiconductor substrate 10 exists between the first and second P-type well regions 131 and 132, so the first source/drain region 151 may be in contact with both the second P-type well region 132 and the semiconductor substrate 10. Although there is a drawback that the resistance increases due to the portion of semiconductor substrate 10 existing between the first and second P-type well regions 131 and 132, there is a corresponding benefit of increasing the breakdown voltage of the semiconductor device. Further, the portion of semiconductor substrate 10 existing between the first and second P-type well regions 131 and 132 serves to reduce the value of Vt because the dopant concentration of the P-type semiconductor substrate 10 existing between the first and second P-type well regions 131 and 132 is lower than the dopant concentration of the second P-type well region 132.

As illustrated in FIG. 1A, the asymmetric second P-type well region 132 may be formed in contact with the first N-type source/drain region 151. Alternatively, the asymmetric second P-type well region 132 can have a structure of partially encompassing the first N-type source/drain region 151 as shown in FIG. 11(a). Herein, the structure formed in contact with the first N-type source/drain region 151 (FIG. 1A) has an effect of reducing the linear threshold voltage (hereinafter, Vt (linear)) in comparison to the structure of partially encompassing the first source/drain region 151 (FIG. 11(a)), which has an effect of increasing the Vt (linear) value.

The asymmetric second P-type well region 132 can be formed spaced apart from the first N-type source/drain region 151 by a portion of the semiconductor substrate 10 (not illustrated). This has an effect of further reducing the Vt (linear) value. When the Vt (linear) value is lowered, the drain current (Idsat) value is increased. This is because, for a given gate voltage, the lower the linear threshold voltage, the greater the amount of current. The farther the asymmetric second P-type well region 132 is away from the first source/drain region 151, the larger the cross-sectional area of the semiconductor substrate 10 existing between the P-type first well region 131 and the second well region 132 becomes. Accordingly, the Vt (linear) value decreases, and the Rdson value also decreases. P-type concentration is lower in the semiconductor substrate 10 compared to the second well region 132, so the larger the area occupied by the semiconductor substrate 10 under the gate electrode 120, the lower the turn-on threshold voltage Vt.

The NMOS device includes a gate insulating layer 121 and a gate electrode 120 formed on the semiconductor substrate 10. As shown in FIG. 1A, for example, a first edge of gate insulating layer 121, on a first side of gate electrode 120, partially overlaps the first N-type source/drain region 151, and a second edge of gate insulating layer 121, on a second side of the gate electrode 120 that is opposite to the first side, partially overlaps the second N-type source/drain region 152. Also, the NMOS device further includes a first trench 111 formed between the first N-type source/drain region 151 and the first P-type bulk region 161 in the substrate 10. The NMOS device further includes a second trench 112 formed between the second N-type source/drain region 152 and the second P-type bulk region 162. The second trench 112 electrically separates the second source/drain region 152 from the second P-type bulk region 162.

The asymmetric second P-type well region 132 is formed apart from the first trench 111. Spacers 171 and 172 are formed on the respective side walls of the gate electrode 120. The NMOS device includes a first spacer 171 formed overlapped with the first N-type source/drain region 151. The NMOS device is a semiconductor device in which the edge of the asymmetric second P-type well region 132 may or may not exceed the outer edge of the first spacer 171. In addition, the NMOS device includes a P-type second bulk region 162 formed inside the second P-type well region 132. The second P-type bulk region 162 is formed apart from the second N-type source/drain region 152.

To sum up, the NMOS device includes the semiconductor substrate 10, the first and second P-type well regions 131 and 132, the first and second trenches 111 and 112, the gate insulating layer 121, the gate electrode 120, the spacers 171 and 172, the first and second source/drain regions 151 and 152, the N-type asymmetric LDD (lightly doped drain) region 142, and the first and second P-type bulk regions 161 and 162. Herein, the NMOS device includes the first to third contact plugs 181-183 and metal wirings 184 to 186.

Hereinafter, a specific configuration of each component of the NMOS device according to an example of the present disclosure shown in FIG. 1A will be described.

The first and the second trenches 111 and 112 are formed in the semiconductor substrate 10. The first and second P-type well regions 131 and 132 are either in touch with or below the first and the second trenches 111 and 112 formed in the semiconductor substrate 10, respectively. Therefore, the depths of the first and the second well regions 131 and 132 are formed deeper than the depths of the first and second trenches 111 and 112. The first and second well regions 131 and 132 are spaced apart from each other on respective sides of the gate electrode 120.

The gate insulating layer 121 is formed on the semiconductor substrate 10. The gate electrode 120 is formed between the first and the second trenches 111 and 112 on the gate insulating layer 121. The first and second source/drain regions 151 and 152 are formed close to the gate insulating layer 121.

The N-type asymmetric LDD region 142 is formed close to the second P-type well region 132 and the second source/drain region 152. Although a low voltage (LV) LDD region is not separately formed on the first source/drain region 151 in the illustrated embodiment, a LV LDD region can be formed on the first source/drain region 151 out of necessity. The first source/drain region 151 is formed in contact with the semiconductor substrate 10 located between the first and second well regions 131 and 132. In general, the second P-type well region 132 completely surrounds the lower periphery of the second source/drain region 152. In contrast, according to an example of the present disclosure, only a partial region of a lower periphery the first source/drain region 151 is formed in contact with the second P-type well region 132, and the rest of the lower periphery is formed in contact with the semiconductor substrate 10.

Meanwhile, the doping profiles of the semiconductor substrate 10 at the second source/drain region 152 and the first source/drain region 151 are different from each other in the vertical direction and the horizontal direction. In the vertical direction, features formed at the second source/drain region 152 are in the order of the second source/drain region 152, the second well region 132 and the substrate 10, and features formed at the first source/drain 151 are in the order of the first source/drain region 151 and the substrate 10. Thus, the doping profiles are different from each other. In the horizontal direction, features formed at the second source region are in the order of the second source/drain region 152 and the asymmetric LDD region 142, and features formed at the first source/drain 151 are in the order of the first source/drain region 151 and the second well region 132. Thus, the doping profiles at the first and second source/drain regions 151 and 152 are different from each other.

The first and second P-type bulk regions 161 and 162 are respectively formed close to the first and the second trenches 111 and 112. The first and second P-type bulk regions 161 and 162 are much higher in doping concentration than the doping concentrations of the first P-type well region 131 and the second P-type well region 132, and have a low resistance. Therefore, the first and second P-type bulk regions 161 and 162 are necessary to reduce the resistance when applying a bias to the first P-type well region 131 and the second P-type well region 132, respectively. In general, only one bulk region is needed in the well region. On the contrary, according to an example of the present disclosure, there are two well regions 131 and 132 having a same conductivity type spaced apart from each other in one transistor or semiconductor element. Therefore, a bulk region or a well-tap region having a concentration higher than the concentration of the well region is required for each well region.

The first contact plug and the metal wiring 181 and 184 are formed on the first bulk region 161. The second contact plug and the metal wiring 182 and 185 are formed on the first source/drain region 151. The third contact plug and the metal wiring 183 and 186 are formed on the second source/drain region 152. The contact plugs 181 to 183 can supply constant voltage such as source voltage or ground voltage.

Meanwhile, according to the manufacturing method of the NMOS device according to an example, in order to reduce the number of masks used for the manufacturing process, the implantation process for forming an N-type well region (N-well) or a P-type well region (P-well) is performed after the gate formation process.

Figure 1B:
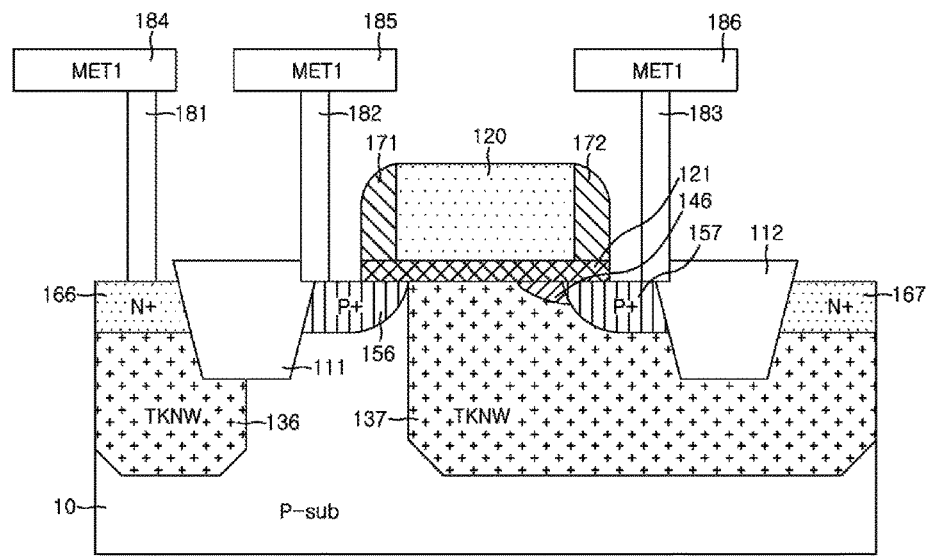
FIG. 1B is a drawing illustrating a structure of a PMOS semiconductor device according to an example.

FIG. 1B is a drawing illustrating the structure of the PMOS semiconductor device according to an example.

As illustrated in FIG. 1B, the PMOS semiconductor device includes the semiconductor substrate 10, the first and second N-type well regions (TKNW) 136 and 137, the first and second trenches 111 and 112, the gate insulating layer 121, the gate electrode 120, the spacers 171 and 172, the first and second P-type (P+) source/drain regions 156 and 157, the P-type asymmetric LDD region (PTK) 146 and the first and second N-type (N+) bulk regions 166 and 167. Herein, the PMOS semiconductor device includes the first to the third contact plugs and metal wirings 181 to 186. As it has a similar structure as the above mentioned asymmetric NMOS semiconductor device, the details are omitted.

FIGS. 2 to 10 are drawings illustrating the structure of the NMOS semiconductor device according to an example.

Hereinafter, referring to FIGS. 2 to 9, particular processes of the manufacturing method of the NMOS device according to an example of the present disclosure will be explained.

Figure 2:
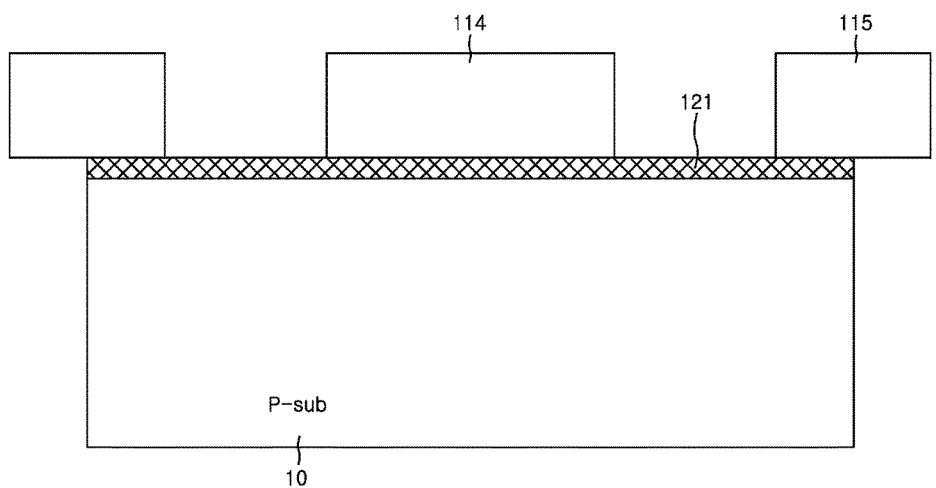
FIGS. 2 to 10 are drawings illustrating the structure of the NMOS semiconductor device according to an example.

FIG. 2 illustrates forming a trench using trench mask patterns 114 and 115 according to an example.

As illustrated in FIG. 2, at the step of forming a trench, a plurality of insulating layers (Oxide/nitride) are formed on the substrate to form gate insulating layer 121, and the first and the second trenches 111 and 112 are formed using the trench mask patterns 114 and 115. For example, trench mask patterns 114 and 115 can be formed as a Shallow Trench Isolation (STI) mask pattern. Herein, instead of the STI, Medium Trench Isolation (MTI) and Deep Trench Isolation (DTI) mask patterns can be used.

Figure 3:
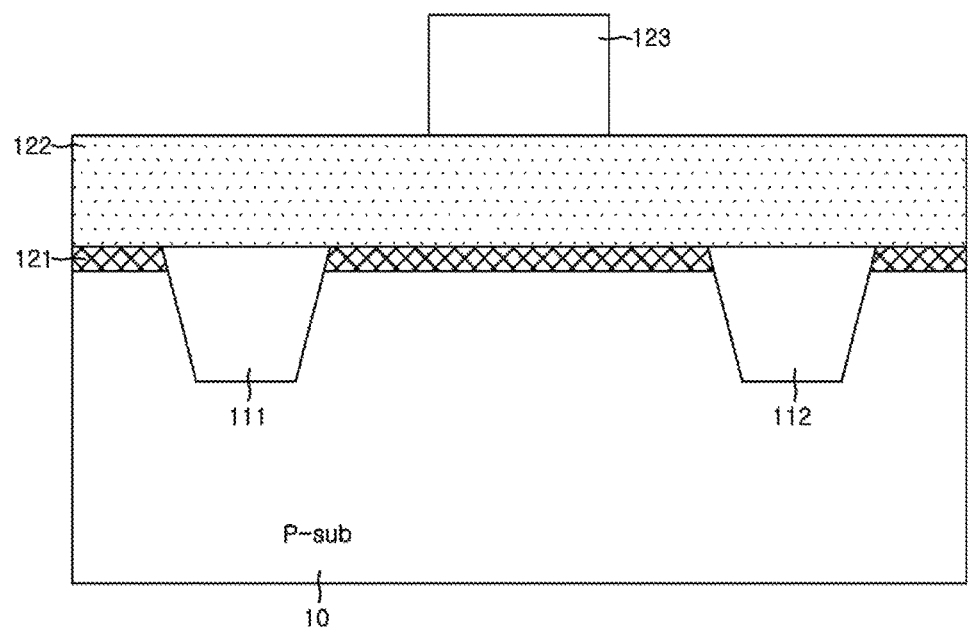

FIG. 3 illustrates forming a gate electrode using a first mask pattern according to an example.

As illustrated in FIG. 3, in the step of forming the gate electrode 120 conductive material 122 is deposited on the gate insulating film 121 formed on the substrate 10. At the step of forming a gate electrode 120, the gate electrode 120 is formed by etching the deposited conductive material 122 using a first mask pattern (FG mask pattern 123). The gate insulating layer 121 is formed as a thick gate oxide using thermal oxidation. For the conductive material 122, poly silicone (Poly-Si) material is used. For the gate electrode 120, the medium voltage gate (MV Gate), between 3 and 30 V can be used.

Figure 4:
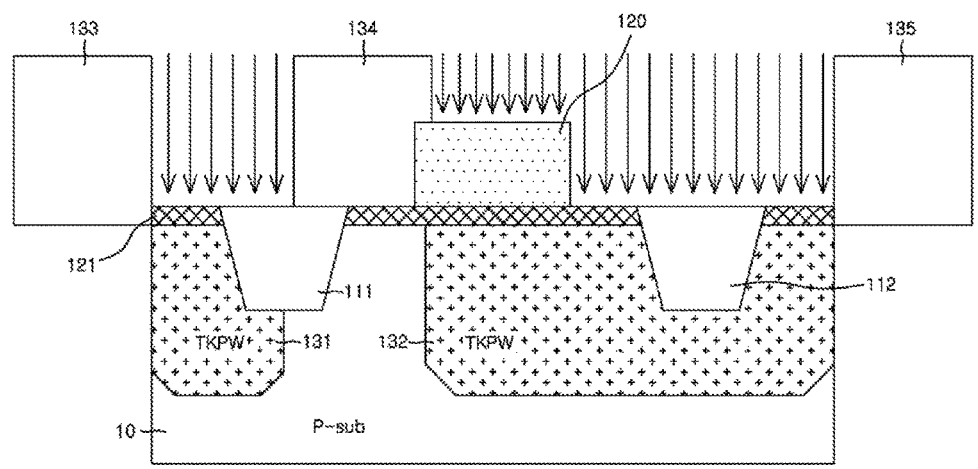

FIG. 4 illustrates forming a well region using second mask patterns 133, 134, and 135 according to an example.

First, in the step of forming the well region, a photoresist (not illustrated) is formed on the substrate 10 and the gate electrode 120. At the step of forming the well region, the second mask patterns 133, 134 and 135, which expose a part of the gate electrode 120, are formed by patterning the photoresist as shown in FIG. 4. The second mask patterns 133, 134, and 135 are formed by using the asymmetric P-type well mask (APW) in the case of the semiconductor device being an NMOS device. In contrast, when the semiconductor device is a PMOS device, an asymmetric N-type well mask (ANW) is used. Herein, the second mask patterns 133, 134 and 135 become asymmetric mask patterns when viewed with respect to the gate electrode 120 as a center. This is because a mask, such as mask 134, is formed only on one side of the gate electrode. The asymmetric LDD regions 142, 143 and the asymmetric P-type well region 132 can be formed using the asymmetric second mask patterns 133, 134, and 135.

Next, in the step of forming the well region, the first implantation is performed so as to pass through a part of the exposed gate electrode 120. Therefore, at the step of forming the well region, a P-type first well region 131 and an asymmetric second P-type well region 132, that are apart from each other, are respectively formed in the substrate 10. The first and the second well regions 131 and 132 are spaced apart, and a portion of the semiconductor substrate 10 that has not been implanted is located in the space between the well regions 131 and 132. After forming the gate electrode 120 illustrated in FIG. 3, forming the well region illustrated in FIG. 4 is performed next.

The first implantation is performed through P-type implantation (TKPW implant) when the semiconductor device is the NMOS device, and the first and second P-type well regions (TKPW, 131 and 132) are formed. In contrast, the first implantation is performed through the N-type ion implantation (TKNW implant) when the semiconductor device is a PMOS device, and the first and second N-type well regions (TKNW, 136 AND 137) illustrated in FIG. 1B are formed.

Figure 5:
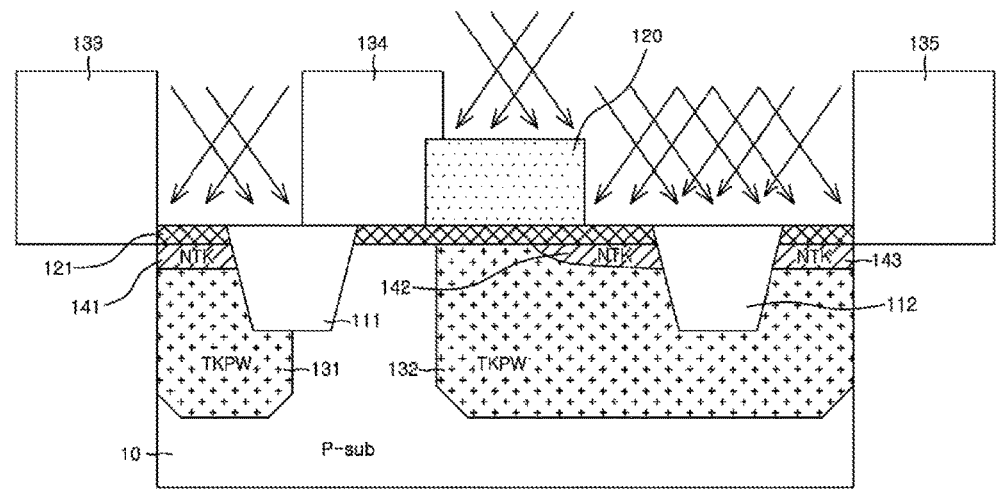

FIG. 5 illustrates forming of an asymmetric LDD using an APW mask according to an example.

As illustrated in FIG. 5, at the step of forming an asymmetric LDD, the N-type asymmetric first LDD (lightly doped drain) region 141 is formed in the first well region 131 by using the formed second mask patterns 133, 134, and 135. The asymmetric second and third N-type LDD regions 142 and 143 are formed on the second well region 132. In the forming of the asymmetric LDD, the second implantation is performed without alteration of the second mask patterns 133, 134, and 135 formed in FIG. 4.

The second implantation can be performed by tilting the angle of implantation. In general, implantation is performed at a 90-degree angle perpendicular to the substrate 10. However, the asymmetric LDD formation step may be performed at an implantation angle of 90 degrees or less so that implantation can be performed even under the gate electrode 120. The lower the angle, the deeper and longer will be the asymmetric LDD region 142 formed under the gate electrode 120. The second implantation energy used for the second implantation is smaller than the first implantation energy used for the first implantation. Therefore, the second implantation cannot pass through the exposed gate electrode 120. The N-type asymmetric LDD region 142 is formed to be overlapped by the gate electrode 120 as a result of thermal diffusion. The asymmetric LDD region 142 is formed in the asymmetric second well region 132 located below the gate electrode 120. The N-type asymmetric LDD region 142 is overlapped by a single side edge of the gate electrode 120.

To block forming of an asymmetric LDD region 142 in the place where the first source/drain region 151 is to be formed, the second mask pattern 134 is formed over the gate electrode 120 and the first trench 111. The asymmetric LDD region 142 is not formed in the first source/drain region 151 by the second mask pattern 134. Therefore, while the N-type second source/drain region 152 is formed in contact with the N-type asymmetric LDD region 142, the first N-type source/drain region 151 is not formed in contact with the N-type asymmetric LDD region 142.

The second implantation is proceeded with N-type implantation (NTK implant) when the semiconductor devices is an NMOS device. Meanwhile, the second implantation is proceeded with P-type implantation (PTK implant) when the semiconductor device is a PMOS device.

The manufacturing method of the semiconductor device according to an example can reduce masks by sequentially proceeding the first implantation and the second implantation to respectively form the first well region, the second well region 131, 132, the first, the second, and the third LDD regions 141, 142, and 143 after the step of forming of the gate electrode 120. Herein, the kind of energy or ion in the first implantation can be different from the second implantation. Thus, at the step of forming LDD at NMOS transistor, the N-type first, second, and third LDD regions 141, 142, and 143 are formed by using the same asymmetric mask pattern used at the step of forming the P-type well region. Similarly, for a PMOS device, at the step of forming LDD, the P-type first, second, and third LDD regions 145, 146, and 147 are formed by using the same asymmetric mask pattern used at the step of forming the N-type well-region. Further, the manufacturing method of the semiconductor device can further reduce the channel length by improving the conventional Rdson performance between the on-state source and drain.

Figure 6:
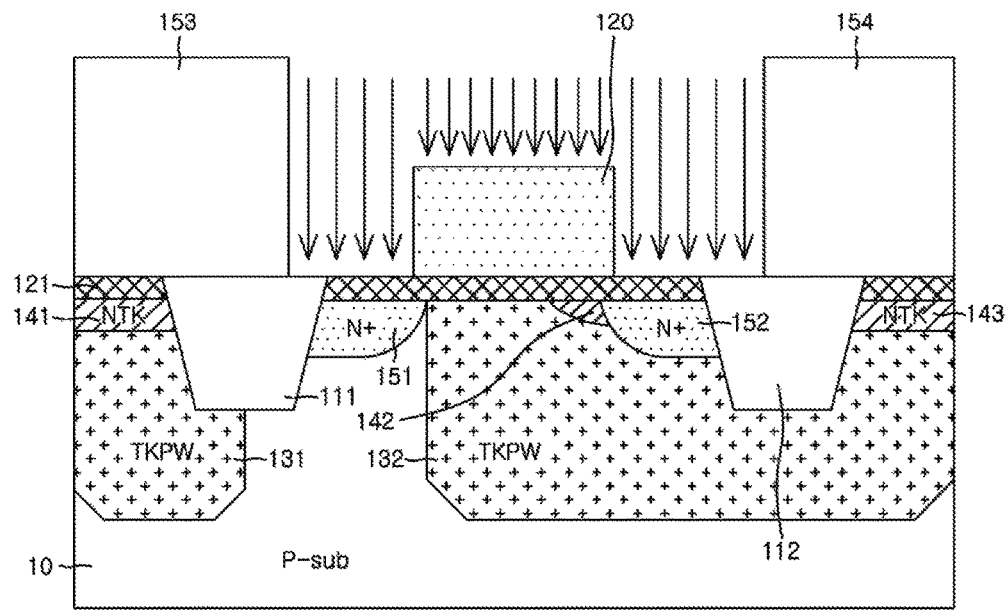

FIG. 6 illustrates forming of the first and second source/drain using the third mask patterns 153 and 154 according to an example.

As illustrated in FIG. 6, at the step of forming the first and second source/drains, the first and second N-type source/drain regions 151, 152 are formed beside the gate electrode 120 on the substrate 10 by exposing the whole gate electrode 120 and performing the implantation.

In particular, at the step of forming the first and the second source/drains, the third mask pattern 153, 154 are formed. The third mask patterns 153, 154 are an N-type mask pattern (NSD mask pattern) when the semiconductor device is an NMOS device. Meanwhile, the third mask patterns 153, 154 are a P-type mask pattern (PSD mask pattern) when the semiconductor device is a PMOS device.

At the step of forming the first and the second source/drains, the first and second N-type source/drain regions 151, 152 are formed by using the third mask patterns 153, 154 and a third implantation. The first and second N-type source/drain regions 151, 152 are N+ source/drain regions when the semiconductor device is an NMOS device. Meanwhile, in the first and second P-type source/drain regions 156, 157 illustrated in FIG. 12, the first and second P-type source/drain regions are P+ regions formed when the semiconductor device is a PMOS device (refer to FIG. 1B). At the step of forming the first and the second source/drains, a second source/drain region 152 is formed in close contact with the asymmetric LDD region 142 located at the lower part of the gate electrode 120.

Figure 7:
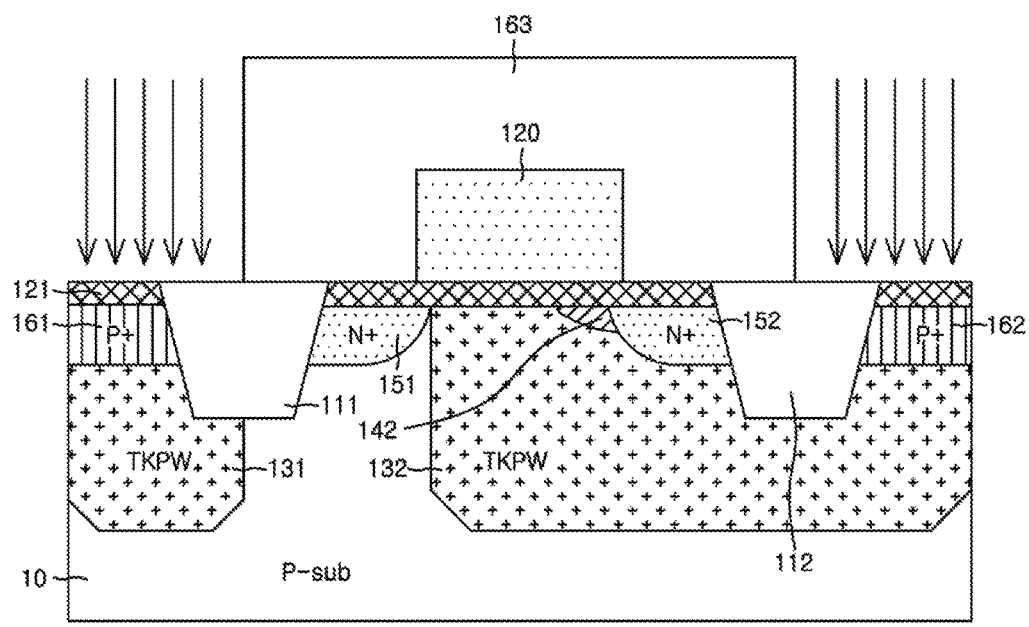

FIG. 7 illustrates forming a bulk region by using the fourth mask pattern according to an example.

At the step of forming a bulk region, the first and second bulk regions 161, 162 are respectively formed beside the first and second N-type source/drain regions 151, 152 in the substrate 10 by masking the whole gate electrode 120 and performing implantation.

In particular, as illustrated in FIG. 7, at the step of forming a bulk region, the fourth mask pattern 163 is formed between the first trench and the second trench 111, 112. The fourth mask pattern 163 is a P-type mask pattern (PSD mask pattern) when the semiconductor device is an NMOS device. Meanwhile, the fourth mask pattern 163 is an N-type mask pattern (NSD mask pattern) when the semiconductor device is a PMOS device.

At the step of forming the bulk region, the P-type first and the second bulk regions 161, 162 are respectively formed in the first and third LDD regions 141, 143 by using the formed fourth mask pattern 163 and using a fourth implantation. The first and the second bulk regions 161, 162 are Well-tap regions.

Figure 8:
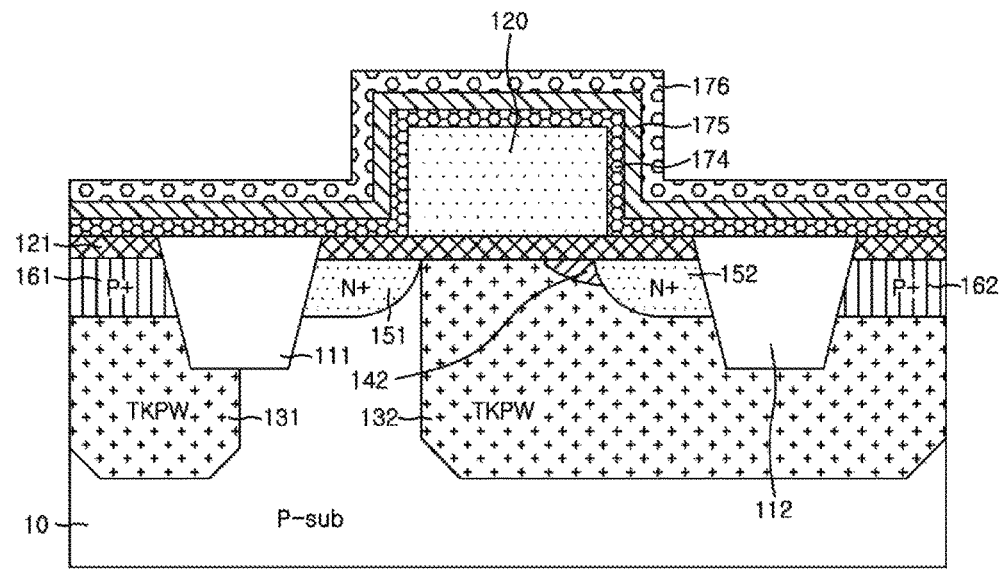
Figure 9:
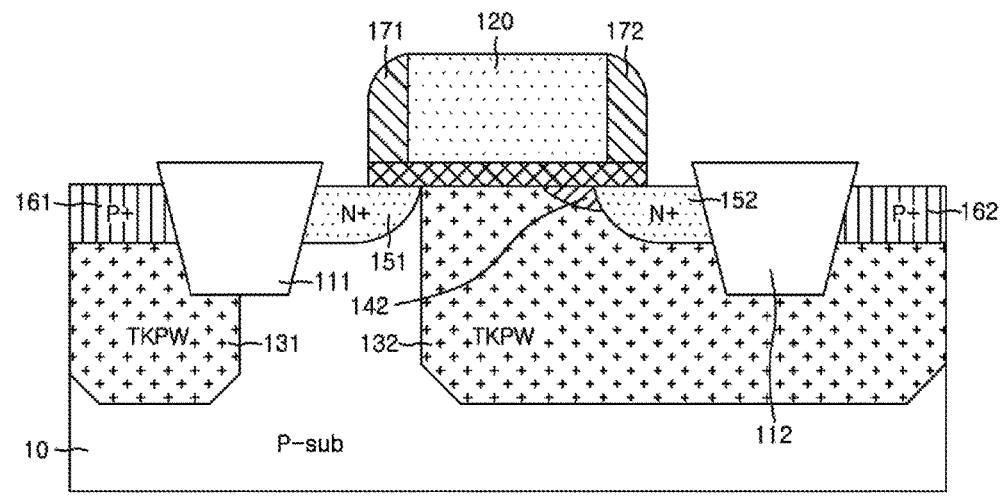

FIG. 8 and FIG. 9 are drawings illustrating the step of forming a spacer according to an example.

As illustrated in FIG. 8, at the step of forming a spacer, a plurality of insulating layers 174, 175, 176 are sequentially formed and the first and second spacers 171, 172 are formed on both the right and left sides of the gate electrode 120. Particularly, at the step of forming a spacer, the first insulating layer 174 is formed by depositing the CVD oxide layer to encompass the gate electrode 120. The first insulating layer 174 is formed by using the process of Chemical Vapor Deposition (CVD). The CVD oxide layer is formed at a pressure lower than the atmospheric pressure at a temperature in the range of 500-700. The first insulating layer 174 is a CVD oxide layer to form LDD spacers 171, 172 later and is deposited through HLD1 (High temperature Low Pressure Deposition). In addition, at the step of forming a spacer, a second insulating layer 175 is formed by depositing the CVD nitride layer on the first insulating layer 174. The second insulating layer 175 is a follow-up of the first insulating layer 174 and is deposited by the CVD Silicon nitride layer. In succession, at the step of forming a spacer, the third insulating layer 176 is formed by depositing the CVD oxide layer on the second insulating layer 175. The third insulating layer 176 is additionally deposited by CVD oxide layer material (HLD2) in the end to improve the thickness of the spacers 171, 172.

As illustrated in FIG. 9, at the step of forming a spacer, the LDD spacers 171, 172 are formed through the LDD etching process. Spacers 171, 172 are finally formed on the side of the gate electrode 120 through the blanket etching process. The spacers 171, 172 are composed of at least three insulating layers 174, 175, and 176, because spacers 171, 172 composed of three insulating layers are more efficient in relieving the stress pressured on the substrate 10 or the gate electrode 120 compared to spacers composed of a double insulating layer.

Figure 10:
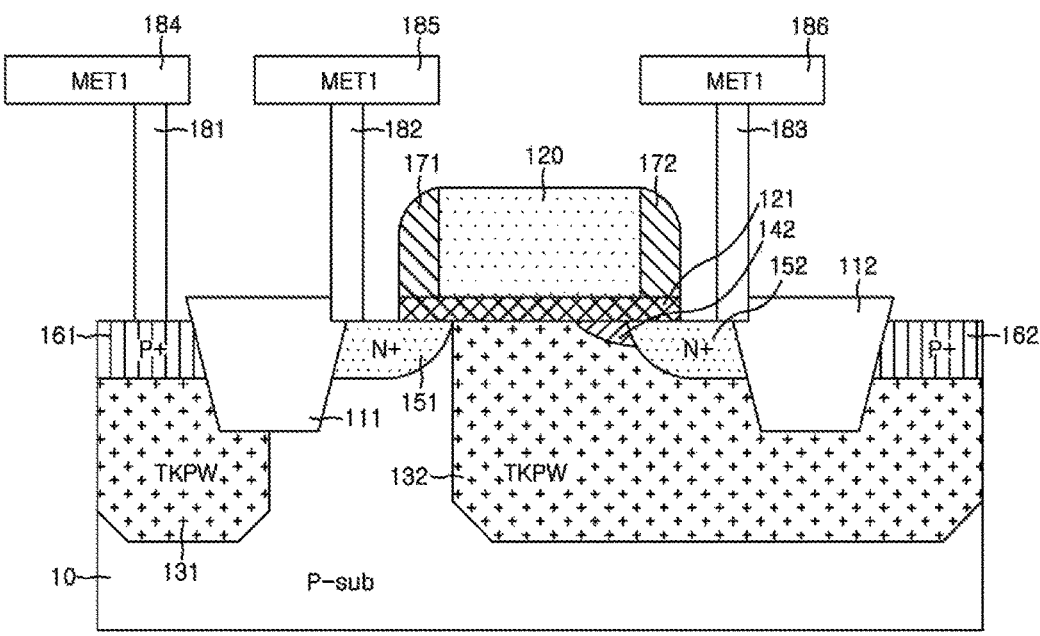

FIG. 10 is a drawing illustrating the step of forming the contact plug and metal pattern on the NMOS device according to an example.

As illustrated in FIG. 10, at the step of forming the contact plug and metal pattern, the first contact plug and the metal wirings 181, 184 are formed in the first bulk region 161. Further, at the step of forming the contact plug and metal pattern, the second contact plug and the metal wiring 182, 185 are formed in the first source/drain region 151. At the step of forming the contact plug and metal pattern, the third contact plug and metal wiring 183, 186 are formed in the second source/drain region 152.

FIGS. 2 to 10 illustrate the manufacturing process of the NMOS semiconductor device, the manufacturing process of the PMOS semiconductor device (refer to FIG. 1B) is performed in a similar way. According to the method of manufacturing the PMOS semiconductor device, the PMOS semiconductor device can be manufactured by reversing the dopant type of implantation. For example, according to the manufacturing method of the PMOS semiconductor device, in case of forming an asymmetric LDD region 146, a P-type asymmetric LDD region 146 can be formed by using a P-type dopant. The method of forming the P-type asymmetric LDD region 146 is also to use the tilted or angled implantation as in the method of forming the N-type asymmetric LDD region 142. Also, by using the PTK mask pattern, the P-type asymmetric LDD region 146 can be formed only in the second source/drain region 157 and not in the first source/drain region 156.

Figure 11:
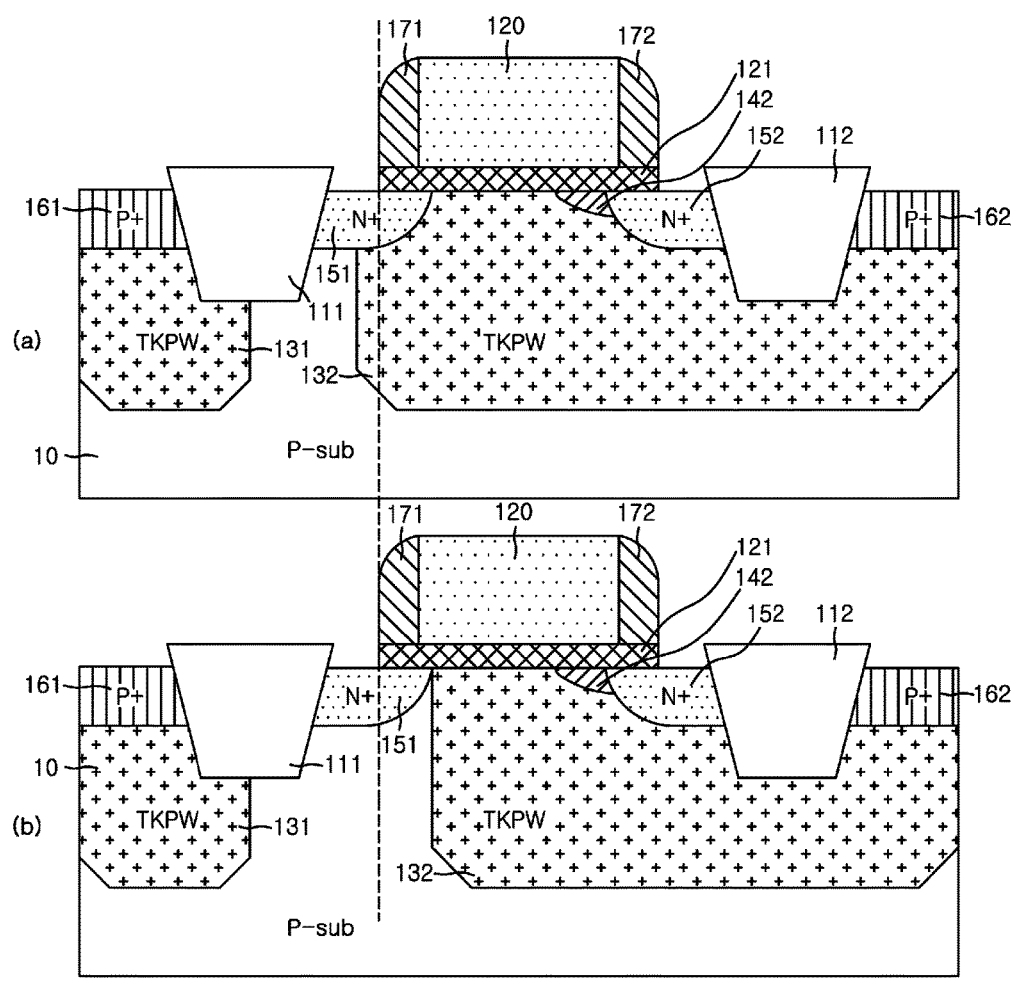
FIG. 11 is a drawing illustrating a structure of the NMOS semiconductor device according to another example.

FIG. 11 is a drawing illustrating the structure of the NMOS semiconductor device according to an example.

The asymmetric second P-type well region 132 formed on the lower part of the gate electrode 120 is formed to extend a pre-determined distance depending on the location of formation of the second mask patterns 133, 134, and 135 and can be formed to encompass a part of the first source/drain region 151 or to be barely in contact with an end of the first source/drain region 151.

As illustrated in (a) of FIG. 11, the second P-type well region 132 may be formed to encompass part of a lower periphery of the first source/drain region 151 based on the first spacer 171 on a side of the gate electrode 120, or can be formed to be barely in contact with a part of the lower periphery of the first source/drain region 151. As illustrated in (b) of FIG. 11, the second P-type well region 132 extends only to an end of the first source/drain region 151 based on a second side of the first spacer 171, and can be formed to be barely in contact with the first source/drain region 151. For example, a formed extent of the second P-type well region 132 can be shifted a distance of as much as −0.2 to 0.5 um relative to the first spacer 171.

Figure 12:
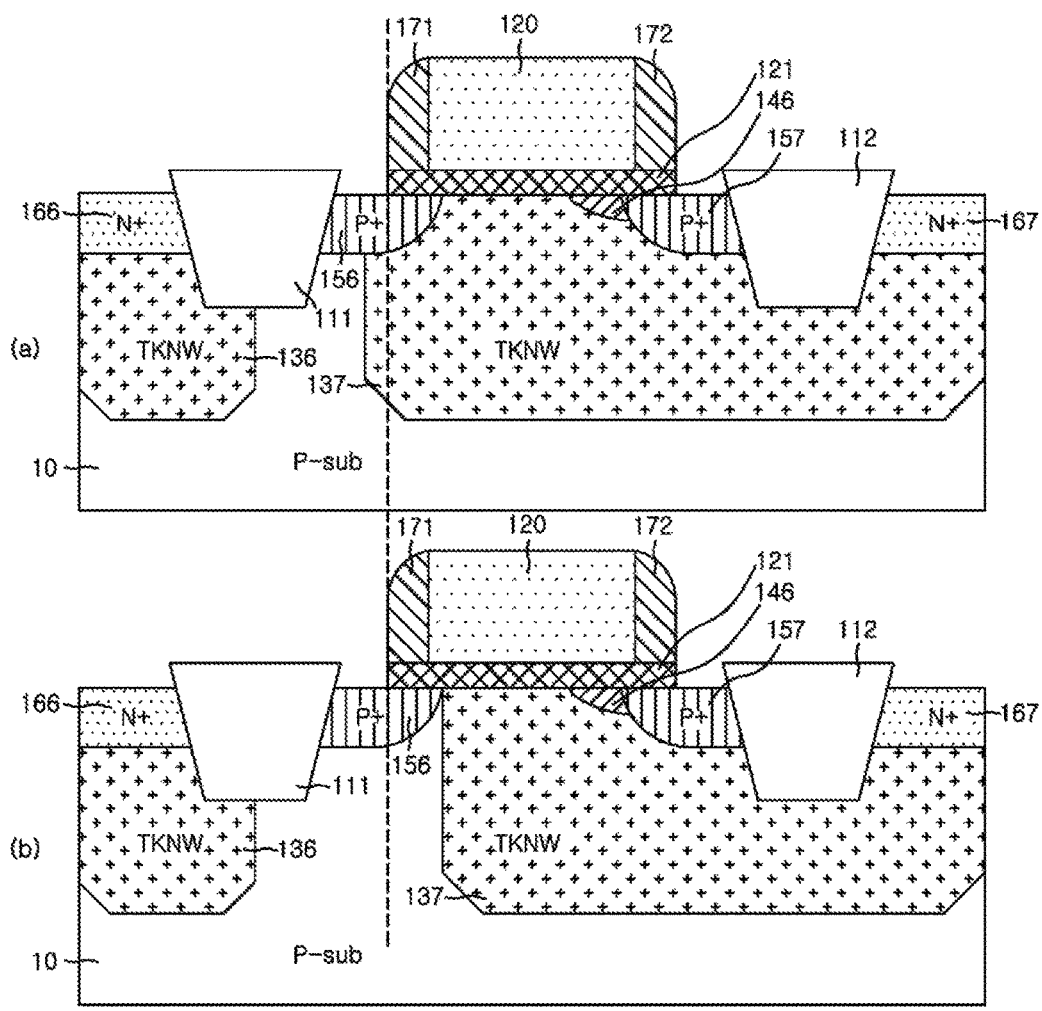
FIG. 12 is a drawing illustrating a structure of the PMOS semiconductor device according to another example.

FIG. 12 is a drawing illustrating the structure of the PMOS semiconductor device according to an example.

As illustrated in (a) of the FIG. 12, the asymmetric second N-type well region 137 may encompass part of a lower periphery of the first source/drain region 156, and the extent of such encompassed part is based on a first side of the first spacer 171 on the side of the gate electrode 120. As illustrated in FIG. 12 (b), the asymmetric second N-type well region 137 can be formed to be barely in contact with a part of the first source/drain region 156. As illustrated in (b) of the FIG. 12, the asymmetric second N-type well region 137 extends to an end of the first source/drain region 156, and the extent is based on the first spacer 171 For instance, a formed extent of the asymmetric second N-type well region 137 can be varied by a distance of as much as −0.2 to 0.5 um relative to a side of the first spacer 171.

Figure 13:
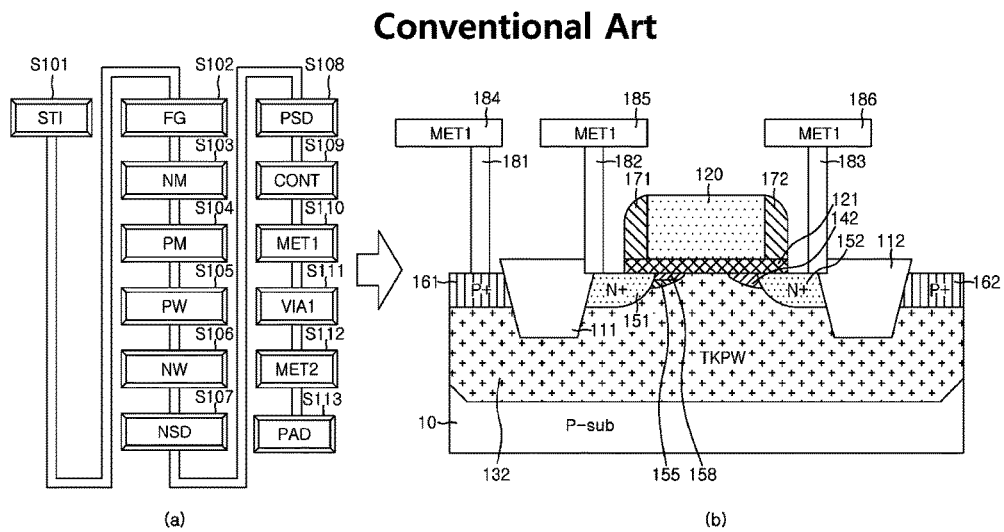
FIG. 13 is a drawing illustrating the mask structure used for a symmetrical medium voltage semiconductor device.

FIG. 13 illustrates the structure of masks used for the medium voltage semiconductor device.

FIG. 13 (a) shows a listing of a plurality of masks used for a medium voltage semiconductor device according to the conventional method. FIG. 13 (b) shows a structure of the medium voltage semiconductor device formed by using the plurality of masks in the conventional method. Herein, the structure of the NMOS device is illustrated, and the PMOS device (not illustrated) is formed concurrently.

As illustrated in (a) of FIG. 13, the masks used for the medium voltage semiconductor device are STI(S101), FG(S102), NM(S103), PM(S104), PW(S105), NW(S106), NSD(S107), PSD(S108), CONT(S109), MET1(S110), VIA1(S111), MET2(S112) and PAD(S113). A total of 13 masks are used. The manufacturing method of a medium voltage semiconductor device uses an NM mask to form an N-type LV LDD region 158. And this manufacturing method forms an N-type NM halo region 155 by using an NM mask because of a concern of punch-through between a source and a drain (S/D) by a short channel. In this case, and in the case of the PM mask, two steps are performed. To form a PMOS device, a P-type LV LDD region (not illustrated) is formed by using the PM mask. And the manufacturing method forms a P-type PM halo region (not illustrated) by using a PM mask because of a concern of punch-through between a source and a drain (S/D) by a short channel.

Figure 14:
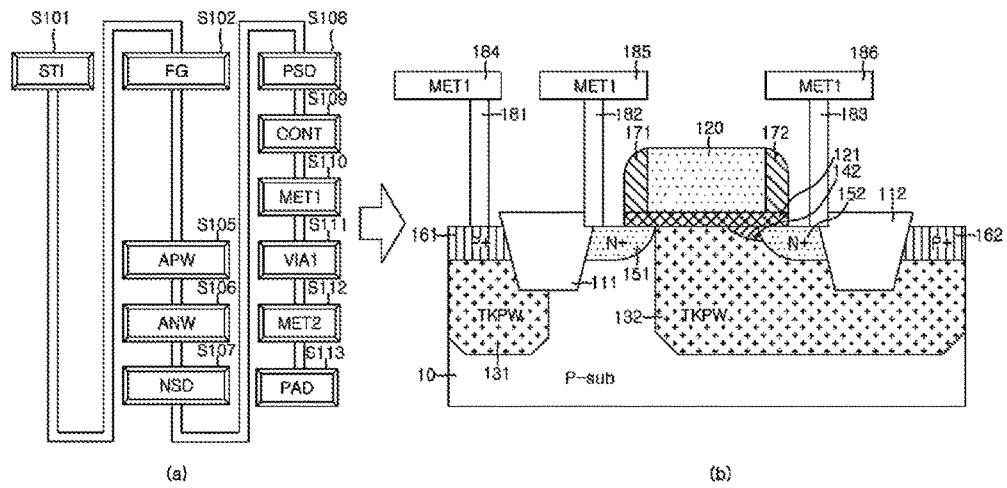
FIG. 14 is a drawing illustrating the mask structure used for an asymmetrical medium voltage semiconductor device according to an example.

FIG. 14 is a drawing illustrating the structure of the mask used for a semiconductor device according to an example of the disclosed invention.

FIG. 14 (a) shows a listing of a plurality of masks used for manufacturing the semiconductor device according to an example. FIG. 14 (b) shows a semiconductor device formed by using a plurality of masks according to an example. Herein, the structure of the NMOS device is illustrated, and the PMOS device (not illustrated) is formed concurrently.

The manufacturing method of the semiconductor device according to an example eliminates the NM (S103) and PM (S104) masks and uses a single asymmetric PW mask, 'APW' (S105), to immediately form an NMOS device (refer to FIG. 1(a)) after the FG (S102) mask. The manufacturing method forms the TKPW and the asymmetric NTK region by using a single mask. And, to form a PMOS device (refer to FIG. 1(b)), the manufacturing method uses 'ANW' (S106) mask, which is a single asymmetric NW mask. The manufacturing method forms the TKNW and PTK regions by using a single mask. Herein, the NMOS and the PMOS devices may be concurrently formed on a single wafer. STI, FG, CONT, MET1, VIA1, VIA2, MET2, and PAD masks are the masks that are used in common between NMOS and PMOS devices. The other four masks (APW, ANW, NSD, PSD) are the masks for respectively forming the features of the NMOS device and the PMOS device.

Therefore, a total number of 11 masks are used. Such manufacturing method can lower the turn-around time (TAT) needed for manufacturing process as well as the cost used for manufacturing masks. The manufacturing method of the semiconductor device according to an example can eliminate two mask processes and improve the characteristic of the semiconductor device. Thus, a semiconductor device as disclosed herein, with low turn-on state source/drain resistance (low Rdson) is competitive in the BCD technology.

Further, as the NM and PM masks are not used, the implantation processes to form the P-type LV LDD region, N-type NM Halo region, N-type LV LDD region, and P-type PM Halo region are eliminated. With at least four implantation processes being eliminated, the cost for manufacturing the semiconductor device is drastically lowered.

As illustrated in FIG. 14 (b), the structure of the asymmetric device according to an example does not form a LDD region in the first source/drain region 151. Compared to the structure of (b) of FIG. 13 illustrating the structure of general asymmetric device, in the structure of (b) of FIG. 14, the chance of the punch-through between the first source/drain region 151 and the second source/drain region 152 is significantly lowered. This is because there is no LDD region beside the first source/drain region 151. Compared to the case in which the LDD region 158 exists (symmetrical device), in the asymmetrical device there is an effect of lengthening the channel by a length of the LDD region 158.

Further, as there is no LDD region 158 in the disclosed examples, the margin for further shortening the length of channel becomes greater. The shorter the channel length, the lower the threshold voltage. By eliminating the LDD region, there is a spatial margin to adjust the channel length to be smaller. A shorter channel can be formed in an asymmetric element than in a symmetric element. Accordingly, under the same condition, the asymmetric device has a lower threshold voltage (Vt) value than the symmetric device. Accordingly, the current between the first source/drain region 151 and the second source/drain region 152 of the asymmetric device increases compared to the symmetric device. An increase in current corresponds to a drop in the Rdson value.

In electrical terms, examples of the present disclosure may be appropriate for a low threshold voltage (low Vth) which is a requirement of a low source/drain resistance (low Rdson) in a turn-on state. While a Halo implant was applied because of a concern of Punch-through when low voltage LDD (LV LDD) is added in conventional examples, the examples of the present disclosure can reduce the threshold voltage by eliminating the Halo implant and LDD ion implant 158 in the first source/drain region 151. Accordingly, the source/drain resistance at turn-on state can be reduced. For example, the examples of the present disclosure can reduce the threshold voltage from 1.2V to 0.8V and can reduce the Channel length.

In terms of quality, the examples of the present disclosure can drastically improve the threshold voltage scattering as they determine the threshold voltage (Vth) by one photo mask (APW or ANW).

Figure 15:
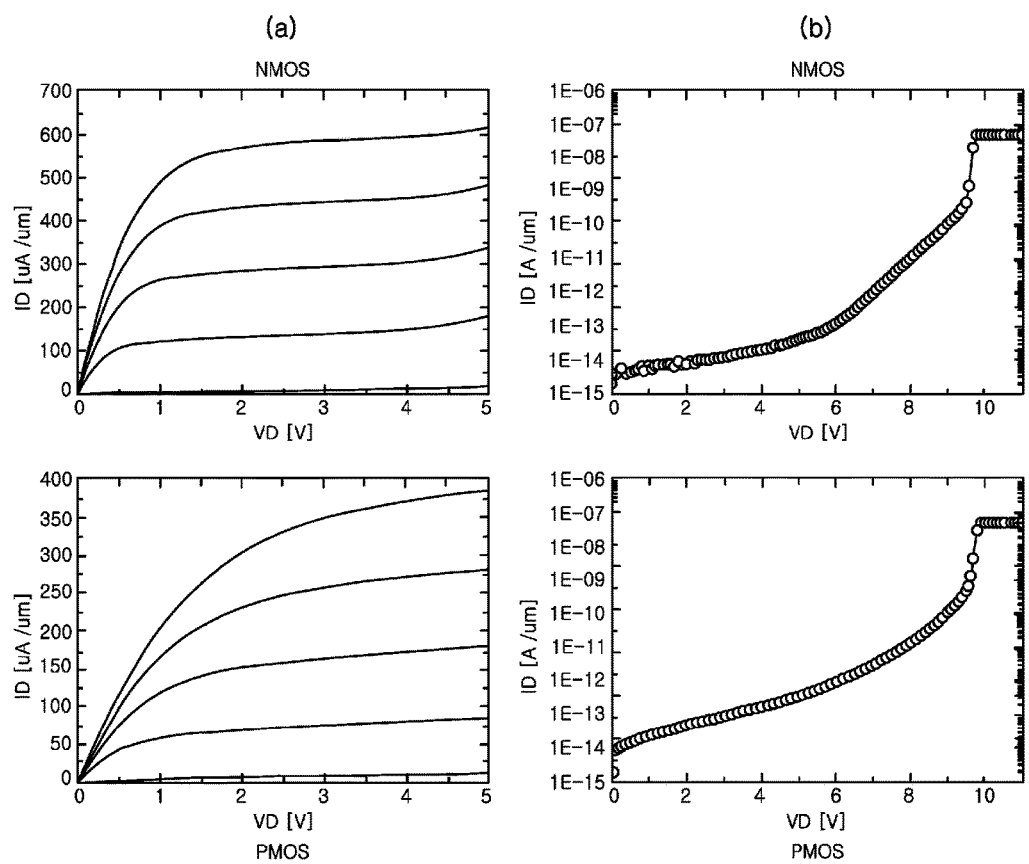
FIG. 15 is a drawing illustrating electronic features of the NMOS semiconductor device and the PMOS semiconductor device according to an example.

FIG. 15 is a drawing illustrating the electrical characteristic of the NMOS and PMOS semiconductor devices according to an example.

As illustrated in (a) of FIG. 15, measurements according to an example of a 5V NMOS semiconductor device and a 5V PMOS semiconductor device are shown. Based on the voltage and current of the second source/drain region, while changing the gate voltage from 1V to 5V, normal voltage and current characteristics of the second source/drain region are measured.

As illustrated in (b) of FIG. 15, the measurements of a semiconductor device according to an example show that the breakdown voltage can be stably generated at about 10V, which is much higher than that of the 5V device.

Figure 16:
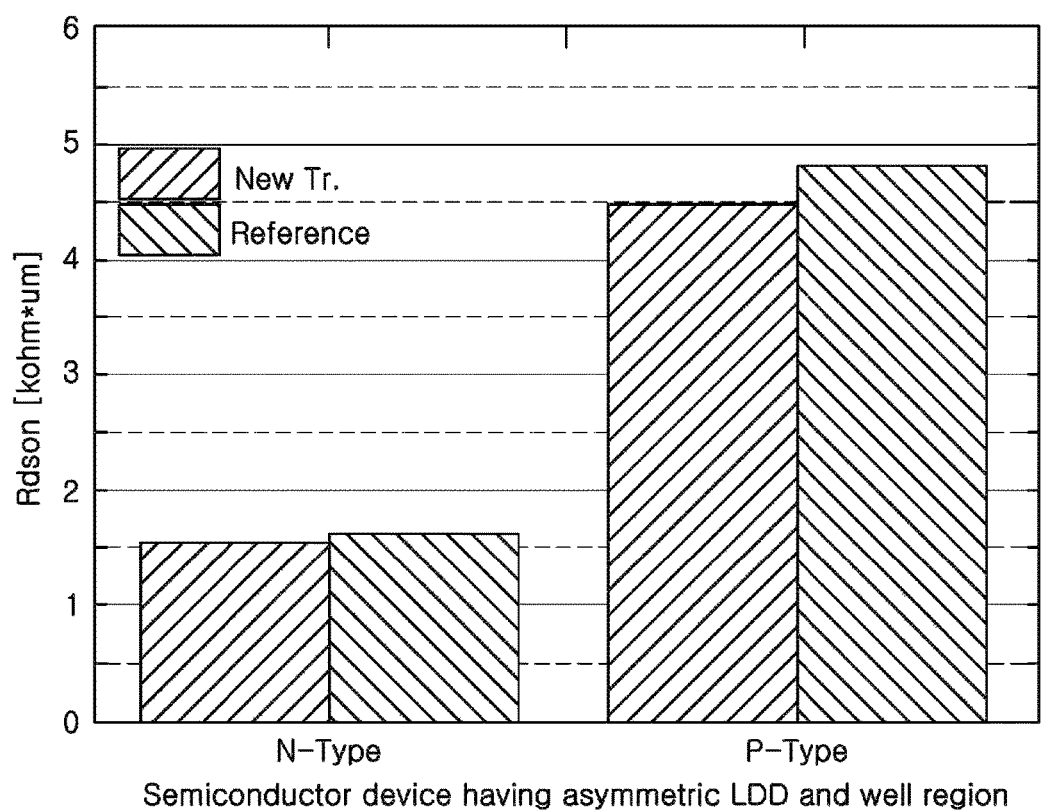
FIG. 16 is a drawing that compares on-state resistance between source/drain of the asymmetrical semiconductor device according to an example and a symmetrical medium voltage semiconductor device.

FIG. 16 is a drawing comparing the on-state source/drain resistance of the example of the present disclosure and that of the conventional medium voltage device.

The resistance between the on-state source and drain (Rdson) can be calculated as below [equation 1].

$$Rdson = \frac{Vd \cdot lin}{Id \cdot lin} * \text{Width}(um) * 1e3 \qquad \text{[equation 1]}$$

Herein, Rdson is a resistance between the on-state source and drain. The linear voltage (Vd. lin) and the linear current (Id. lin) represent the drain voltage and current in the linear state. Width refers to the channel width (width).

The second source/drain to first source/drain resistance in a turn-on state is the resistance between the second source/drain region 152 and the first source/drain region 151 of the MOSFET. That is, the Drain-Source resistance value when the gate is turned on becomes smaller as the threshold voltage Vth becomes lower. Herein, the smaller the resistance between the second source/drain and the first source/drain in the turn-on state, the better the device performance.

As illustrated in FIG. 16, the resistance between the second source/drain and the first source/drain in the turn-on state of the semiconductor device (New Tr.) according to the example of the present disclosure is reduced compared to that of the medium voltage semiconductor device.

The examples of the present disclosure can further reduce the on-state resistance between the source/drain (Rdson) by using the asymmetric LDD structure and well structure.

Further, examples of the semiconductor devices according to the present disclosure can be manufactured at low cost by reducing the number of masks used for a semiconductor device through forming the well region and the LDD region, after the gate formation, using the same mask pattern.

The examples according to the disclosed methods use two fewer masks than previously required for manufacturing the semiconductor device and also eliminate the conventional implantation procedure. Accordingly, the manufacturing cost of the semiconductor device will be drastically reduced.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A semiconductor device comprising:
a first P-type well region and a second P-type well region, asymmetric to the first P-type well region, each formed in a semiconductor substrate;
a gate insulating layer and a gate electrode formed on the substrate;
a first N-type source/drain region and a second N-type source/drain region formed on respective sides of the gate electrode; and
a N-type lightly diffused drain (LDD) region formed asymmetrically with respect to the gate electrode and extending from the second N-type source/drain region,
wherein the second P-type well region encompasses the second N-type source/drain region and the N-type LDD region, and
wherein the first N-type source/drain region contacts both the second P-type well region and a region of the substrate adjacent to the second P-type well region.

2. The semiconductor device of claim 1, further comprises,
a first P-type bulk region formed apart from the first N-type source/drain region and inside the first P-type well region,
a second P-type bulk region formed apart from the second N-type source/drain region and inside the second P-type well region;
a first trench formed between the first N-type source/drain region and the first P-type bulk region; and
a second trench formed between the second N-type source/drain region and the second P-type bulk region.

3. The semiconductor device of claim 1, further comprises,
a first spacer that is formed overlapped with the first source-drain region; and
a second spacer that is formed overlapped with the second N-type source/drain region.

4. The semiconductor device of claim 2,
wherein the second P-type well region is formed apart from the first trench.

5. The semiconductor device of claim 3,
wherein an edge of the second P-type well region does not extend beyond an outer edge of the first spacer.

6. The semiconductor device of claim 1,
wherein the N-type LDD region is not formed in the first N-type source/drain region.

7. The semiconductor device of claim 1,
wherein the second P-type well region partially encompasses the first N-type source/drain region.

8. The semiconductor device of claim 1,
wherein a cross-sectional area of the second P-type well region is different from a cross-sectional area of the first P-type well region.

9. A manufacturing method of a semiconductor device, the method comprising:
forming a gate insulating layer and a gate electrode on a substrate;
forming a photoresist on the substrate and on the gate electrode;

forming an asymmetric mask pattern, that exposes a portion of the gate electrode, by patterning the photoresist;

forming an asymmetric P-type well region in the substrate, using the asymmetric mask pattern, by performing a first implantation that passes through the exposed portion of the gate electrode;

forming an asymmetric N-type LDD region in the P-type well region by performing a second implantation using the asymmetric mask pattern as a mask; and forming a first N-type source/drain region and a second N-type source/drain region on respective sides of the gate electrode on the substrate; and wherein the second N-type source/drain region is formed in contact with the asymmetric N-type LDD region, and wherein the asymmetric P-type well region is formed to encompass the second N-type source/drain region and not encompass the first N-type source/drain region.

10. The manufacturing method of a semiconductor device of claim 9, wherein the second implantation is an angled implantation in which an implantation angle is inclined with respect to an upper surface of the substrate.

11. The manufacturing method of a semiconductor device of claim 9, further comprising, forming a first spacer overlapping with the first N-type source/drain region; and forming a second spacer overlapping with the second N-type source/drain region, wherein an edge of the asymmetric P-type well region does not exceed an outer edge of the first spacer.

12. The manufacturing method of a semiconductor device of claim 9, wherein the asymmetric N-type LDD region is not formed in contact with the first N-type source/drain region.

13. The manufacturing method of semiconductor device of claim 9, further comprises, forming a first trench and second trench in the substrate;

forming a first P-type bulk region spaced apart from the first N-type source/drain region by the first trench;

and forming a second P-type bulk region spaced apart from the second N-type source/drain region by the second trench.

14. A semiconductor device comprising:

a P-type semiconductor substrate on which a gate insulating layer is formed;

a gate electrode formed on the gate insulating layer;

first and second N-type source/drain regions formed in the semiconductor substrate, and overlapped by respective edges of the gate insulating layer on opposite first and second sides of the gate electrode;

a first P-type well region formed in the semiconductor substrate on the first side of the gate electrode;

a second P-type well region formed in the semiconductor substrate on the second side of the gate electrode, and extending under the gate electrode; and an N-type lightly diffused drain (LDD) region extending under the gate electrode, from a first end of the second N-type source/drain region, toward the first N-type source/drain region.

15. The semiconductor device of claim 14, wherein at a location under the gate electrode, the second P-type well region is in contact with both of an end of the first N-type source/drain region and a lower surface of the gate insulating layer.

16. The semiconductor device of claim 15, wherein the second P-type well region is in contact with the first N-type source/drain region at a location that is not under the gate electrode.

17. The semiconductor device of claim 14, wherein the first and second P-type well regions are separated by a portion of the semiconductor substrate beneath the first N-type source/drain region.

18. The semiconductor device of claim 14, further comprising a first trench formed in the semiconductor substrate between the first P-type well region and the first N-type source/drain region; and a second trench formed in the semiconductor substrate in contact with a second end of the second N-type source/drain region that is not under the gate electrode.

19. The semiconductor device of claim 18, wherein the second P-type well region is in contact with opposite sides of the second trench.

20. The semiconductor device of claim 14, further comprising a P-type first bulk region formed in the first P-type well region; and a second P-type first bulk region formed in the second P-type well region.

* * * * *